United States Patent
Liu

(10) Patent No.: US 9,041,213 B2
(45) Date of Patent: May 26, 2015

(54) MICROELECTROMECHANICAL SYSTEM DEVICES HAVING THROUGH SUBSTRATE VIAS AND METHODS FOR THE FABRICATION THEREOF

(71) Applicant: Lianjun Liu, Chandler, AZ (US)

(72) Inventor: Lianjun Liu, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 1 day.

(21) Appl. No.: 13/828,810

(22) Filed: Mar. 14, 2013

(65) Prior Publication Data

US 2014/0264909 A1   Sep. 18, 2014

(51) Int. Cl.
*B81C 1/00* (2006.01)
*B81B 7/00* (2006.01)

(52) U.S. Cl.
CPC ........... *B81C 1/00301* (2013.01); *B81B 7/0006* (2013.01)

(58) Field of Classification Search
CPC ............... H01L 2224/48465; H01L 23/12; H01L 2224/48145; H01L 23/10; H01L 23/585; H01L 21/50; H01L 23/49822
USPC ................. 257/704, E21.499, E23.178, 678; 438/51, 107, 455, 618, 64
See application file for complete search history.

(56) References Cited

U.S. PATENT DOCUMENTS

| | | | |
|---|---|---|---|
| 6,033,991 A * | 3/2000 | Ramkumar et al. | 438/713 |
| 6,936,918 B2 * | 8/2005 | Harney et al. | 257/704 |
| 7,081,647 B2 | 7/2006 | Mushika | |
| 8,105,941 B2 | 1/2012 | Huang | |
| 2010/0133630 A1 * | 6/2010 | Scheuerer et al. | 257/417 |

OTHER PUBLICATIONS

USPTO, Non-Final Office Action in U.S. Appl. No. 13/781,391, mailed Mar. 27, 2014.
United States Patent & Trademark Office, Notice of Allowance and Fees Due for U.S. Appl. No. 13/781,391, mailed Aug. 13, 2014.

* cited by examiner

*Primary Examiner* — Stephen W Smoot
*Assistant Examiner* — Edward Chin
(74) *Attorney, Agent, or Firm* — Ingrassia Fisher & Lorenz, P.C.

(57) ABSTRACT

Methods for the fabrication of a Microelectromechanical Systems ("MEMS") devices are provided, as are MEMS devices. In one embodiment, the MEMS device fabrication method includes forming at least one via opening extending into a substrate wafer, depositing a body of electrically-conductive material over the substrate wafer and into the via opening to produce a via, bonding the substrate wafer to a transducer wafer having an electrically-conductive transducer layer, and forming an electrical connection between the via and the electrically-conductive transducer layer. The substrate wafer is thinned to reveal the via through a bottom surface of the substrate wafer, and a backside conductor is produced over a bottom surface of the substrate wafer electrically coupled to the via.

20 Claims, 10 Drawing Sheets

MICROELECTROMECHANICAL SYSTEM DEVICES HAVING THROUGH SUBSTRATE VIAS AND METHODS FOR THE FABRICATION THEREOF

TECHNICAL FIELD

Embodiments of the present invention relate generally to microelectronic devices and, more particularly, to Microelectromechanical System ("MEMS") devices having through substrate vias, as well as to methods for the fabrication of such MEMS devices.

BACKGROUND

Microelectromechanical Systems ("MEMS") devices are employed as actuators and sensors in a wide variety of applications. Capacitive-sensing MEMS devices, for example, are now commonly employed in many different electronic devices to sense acceleration, vibration, device orientation, and other inertia-related parameters. Such MEMS devices function by sensing changes in capacitance between electrodes in a transducer structure. The transducer structure may include, for example, a number of stationary electrodes or "fingers" interposed with and spaced apart from a number of movable electrodes or "fingers" in a comb-type arrangement. The movable electrodes are rigidly joined to a larger movable structure commonly referred to as a "proof mass," which is resiliently suspended over an underlying substrate. During operation of the MEMS device in an example, a voltage differential is applied across the stationary or movable electrodes. As the proof structure moves in response to acceleration of the MEMS device, the movable electrodes are displaced with respect to the fixed electrodes and the capacitances between the electrodes vary accordingly. By monitoring these capacitances, the acceleration or other movement of the MEMS device can be determined.

Interconnect lines route electrical signals from the electrodes of the transducer structure to bond pads or other contacts located on the exterior of the MEMS device. Depending upon the particular manner in which the MEMS device is fabricated, the bond pads may be formed on laterally-projecting ledges of the MEMS device referred to as "bond pad shelves." Such an arrangement is often employed in implementations wherein the MEMS device includes a cover portion or cap, which sealingly encloses the transducer structure to prevent environmental contamination thereof. In one common package architecture, the bond pads of the MEMS device are electrically connected to a MEMS-monitoring circuit, such as an application specific integrated circuit, packaged with the MEMS device. In implementations wherein the bond pads are formed on bond pad shelves and, therefore, disposed at an elevation between the upper and lower surfaces of the MEMS device, wire bonding is typically required to form the desired electrical connections between MEMS bond pads and the MEMS-monitoring circuit.

BRIEF DESCRIPTION OF THE DRAWINGS

At least one example of the present invention will hereinafter be described in conjunction with the following figures, wherein like numerals denote like elements, and.

Figure 1:
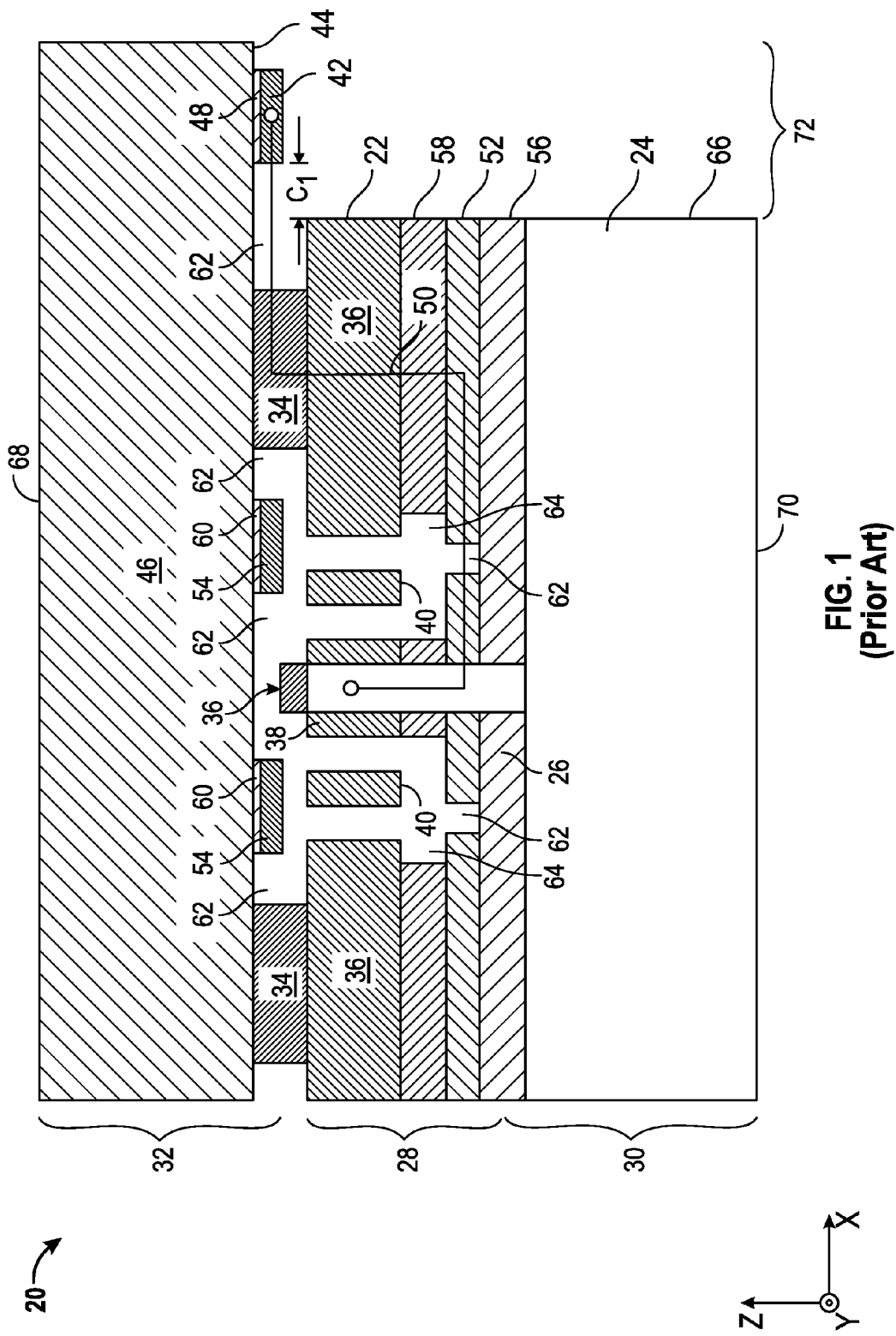
FIG. 1 is a simplified cross-sectional view of a MEMS device illustrated in accordance with the teachings of prior art and including a laterally-projecting bond pad shelf supporting a number of bond pads, which may be wire bonded to a neighboring integrated circuit (not shown)

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a structure or layer may be described as fabricated "over" or "on" a substrate without indicating that the structure or layer necessarily contacts the substrate due to, for example, presence of one or more intervening layers.

FIG. 1 is a simplified cross-sectional view of a MEMS device 20 and, specifically, a capacitive-sensing MEMS accelerometer illustrated in accordance with the teachings of prior art. MEMS device 20 includes an electrically-conductive transducer layer 22 overlying a MEMS substrate 24. Transducer layer 22 and MEMS substrate 24 may initially be included in two separate workpieces or wafers, which are bonded together during fabrication of MEMS device 20. Such a fabrication process can be utilized to produce high aspect ratio transducer structures included within MEMS devices and may consequently be referred to as a "High Aspect Ratio MEMS" fabrication method or, more simply, as a "HARMEMS" fabrication method. The pieces or portions of these two wafers included in the completed MEMS device 20 (shown in FIG. 1) are thus referred to as a "transducer wafer portion 28" and a "substrate wafer portion 30" herein. In one embodiment, the transducer wafer and substrate wafer are silicon wafers, which are processed in bulk to produce MEMS device 20 along with a number of similar MEMS devices. The other, simultaneously-produced MEMS devices are separated from MEMS device 20 by singulation during production to yield the completed MEMS device 20 shown in FIG. 1.

MEMS transducer layer 22 is patterned to define a primary transducer structure 36 including a number of anchor regions 38 (one of which is shown in FIG. 1) fixedly joined to the underlying substrate 24. Anchor regions 38 are resiliently joined to a relatively large movable body commonly referred to as a "proof mass" (hidden from view in FIG. 1) by a number of spring members 40, which are compliant in the axis or axes along which MEMS device 20 senses acceleration. The proof mass is effectively suspended above substrate 24 and can move, as permitted by deflection of spring members 40, relative to anchor regions 38 and the other stationary structures of MEMS device 20 in response to acceleration thereof. The electrodes of transducer structure 36 are electrically coupled to a row of externally-accessible bond pads 42 (one of which is shown in FIG. 1), which enable interconnection of the sense electrodes of MEMS device 20 with an integrated circuit or other external electronic device. As indicated in FIG. 1, bond pads 42 are disposed on a bond pad shelf 44, which may be defined by a laterally-projecting side portion of a MEMS cap 32 affixed over transducer layer 22 utilizing an electrically-conducive bonding material 34. An intervening dielectric layer 48 provides electrical isolation between bond pads 42 and MEMS cap 32, which may be fabricated from silicon or another electrically-conductive material.

MEMS device 20 is fabricated to include a number of electrically-isolated interconnect lines, which electrically couple the sense electrodes of primary transducer structure 36 to bond pads 42. For purposes of illustration, one such interconnect line 50 is schematically shown in FIG. 1 as electrically coupling anchor region 38 of primary transducer structure 36 to the illustrated bond pad 42. As shown in FIG. 1, the MEMS device 20 may include two such interconnect layers: (i) a first patterned interconnect layer 52, which overlies substrate 24 and underlies transducer layer 22; and (ii) a second patterned interconnect layer 54, which overlies transducer layer 22 and underlies MEMS cap 32. Interconnect layers 52 and 54 are lithographically patterned to create voids or air gaps 62 electrically isolating the interconnect lines. Interconnect layers 52 and 54 are electrically-isolated from the other electrically-conductive layers of MEMS device 20 (e.g., MEMS substrate 24, transducer layer 22, and MEMS cap 32) by a number of interposed dielectric layers. In FIG. 1, MEMS device 20 includes three such dielectric layers: (i) a first dielectric layer 56 formed between MEMS substrate 24 and interconnect layer 52; (ii) a second dielectric layer 58 formed between interconnect layer 52 and transducer layer 22; and (iii) a third dielectric layer 60 formed between interconnect layer 54 and MEMS cap 32. The portions of the interconnect lines extending upwardly or downwardly (along the Z-axis in FIG. 1) through the electrically-conductive regions of MEMS device 20 are likewise electrically isolated by air gaps or columns of dielectric material (not shown in FIG. 1), as conventionally known.

In embodiments wherein MEMS device 20 senses acceleration along the Z-axis, voids 64 may also be created in a central portion of dielectric layer 58 to accommodate deflection of the proof mass of primary transducer structure 36 in a downward direction. Similarly, a vertical standoff may be provided by the thickness of bonding material 34 to accommodate deflection of the proof mass of primary transducer structure 36 in an upward direction. Also, in embodiments wherein MEMS device 20 senses acceleration along the Z-axis, interconnect layers 52 and 54 may also be patterned to define additional sense electrodes for monitoring changes in capacitance along the Z-axis. If electrically-conductive interconnect layer 52 and/or interconnect layer 54 is patterned to include one or more Z-sensing electrodes, such electrodes may likewise be electrically coupled to one or more bond pads provided on the exterior of MEMS device 20 by electrically-isolated interconnect lines of the type described above.

Bond pad shelf 44 is formed by a laterally-projecting or overhanging side portion of MEMS cap 32, which extends beyond a sidewall 66 of MEMS device 20 (defined by vertical edges of transducer wafer portion 28 and substrate wafer portion 30) in a lateral direction. Bond pad shelf 44 and the bond pads 42 supported thereby are thus located between the uppermost surface 68 of MEMS device 20 (the topside of MEMS cap 32) and the lowermost surface 70 of device 20 (the underside of MEMS substrate 24). A lateral clearance $C_1$ is also typically provided between bond pads 42 and the adjacent sidewall of MEMS cap 32 as bond pads 42 may be exposed during fabrication utilizing a partial saw cut to remove area 72 from non-active side portions of transducer wafer portion 28 and substrate wafer portion 30. While such a structural arrangement provides a workable device, the inclusion of bond pad shelf 44 increases the overall die size of MEMS device 20. Additionally, due to the relatively large step height between bond pad shelf 44 and the lower surface 70 of MEMS substrate 24, MEMS device 20 is generally not amenable to Chip Scale Packaging (CSP) processes, such as Redistributed Chip Packaging (RCP) processes. As a result, wire bonding is typically required to form the desired electrical connections between MEMS bond pads 42 and the integrated circuit utilized to drive and monitor MEMS device 20 (not sown in FIG. 1).

To bring about favorable reductions in die size and manufacturing costs, the following described embodiments of a method for fabricating an exemplary MEMS device wherein the need for a bond pad shelf is eliminated; although it will be appreciated that a bond pad shelf may or may not be included in the MEMS devices produced pursuant to the below-described method. Elimination of the need for a bond pad shelf is achieved, at least in part, through the formation of Through-Substrate-Vias ("TSVs"), which route electrical signals and/or voltages between the sense electrodes of the MEMS device and bond pads or other electrical conductors formed on the backside of the MEMS substrate. While other methods of fabricating MEMS devices with TSVs may be known, the MEMS fabrication methods described herein provide certain advantages over other such currently-known fabrication methods. For example, the MEMS fabrication method described herein can be implemented as a modified HARMEMS fabrication method wherein the substrate and transducer wafers are consolidated or combined, possibly in conjunction with a cap wafer, during fabrication of the MEMS device. Notably, in such cases, and in contrast to other known HARMEMS fabrication methods, the need for metal routing on the MEMS cap can be eliminated thereby enabling the usage of so-called "dumb caps" lacking such interconnect features and utilized solely for hermetic sealing purposes; although the possibility that the MEMS devices can include metal routing or other interconnect features formed on a MEMS cap in addition to one or more TSVs is by no means precluded. Embodiments of the below-described method also facilitate the formation of photolithographical alignment features on the backside of the ground or thinned MEMS substrate in conjunction with formation of the TSVs. Additional benefits of the below-described MEMS manufacturing methods will also become apparent in the course of the subsequent description.

Embodiments of the below-described fabrication method are described in conjunction with the fabrication of an exemplary MEMS device 80, which is shown at various stages of completion in FIGS. 2-17. The following example notwithstanding, it should be understood that embodiments of the fabrication method described herein can be utilized to produce a variety of different types of MEMS devices, which may differ form MEMS device 80 in structure and function. Furthermore, while MEMS device 80 is well-suited for usage as an accelerometer and may consequently be described below as such, it is emphasized that embodiments of the MEMS devices described herein are by no means limited to implementation as accelerometers. Rather, the fabrication methods described herein can be utilized to produce MEMS actuators with appropriate design modifications to produce a capacitive actuation structure, as well as other types of MEMS sensors, such as gyroscopes, magnetometers, pressure sensors, and the like. It will further be appreciated that the fabrication steps described below in conjunction with FIGS. 2-17 can be performed in alternative orders, that certain steps may be omitted, and that additional steps may be performed in alternative embodiments. Description of structures and processes known within the MEMS device and semiconductor industries may be limited or omitted entirely without providing the well-known process details.

Figure 2:
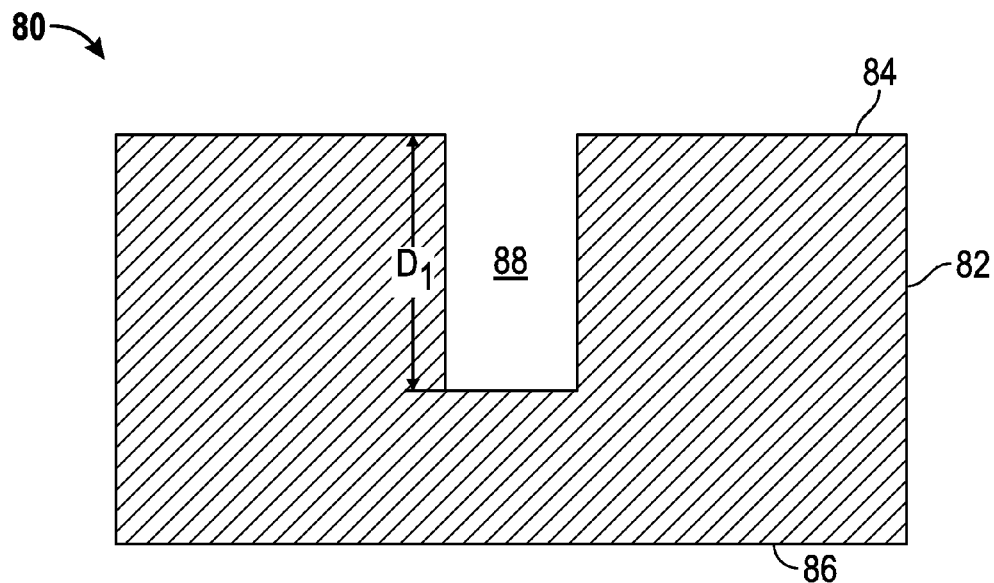
FIGS. 2-17 are simplified cross-sectional view of a MEMS devices shown at various stages of manufacture and including one or more Through-Substrate Vias ("TSVs") providing electrical connection to one or more bond pads formed on the bottom surface of the MEMS device, as illustrated in accordance with an exemplary and non-limiting embodiment of the present invention.

FIGS. 2-17 are simplified cross-sectional view of a MEMS device 80 shown at various stages of manufacture, as produced in accordance with an exemplary embodiment of the MEMS manufacturing method. Referring initially to FIG. 2, the exemplary manufacturing method commences with the provision of a MEMS substrate 82 having an upper surface 84 and a lower surface 86. MEMS substrate 82 may be comprised of at least one semiconductor material and is preferably comprised of silicon. For example, substrate 82 may be a single crystal silicon substrate produced by singulation of a bulk silicon wafer, as performed at a later juncture in the fabrication process; e.g., in one common volume manufacturing technique, multiple MEMS devices are simultaneously fabricated in parallel on a bulk silicon substrate, which is later singulated to produce substrate 82 and a number of like substrates included within other MEMS devices. However, for ease of illustration and description, the fabrication method depicted in conjunction with FIGS. 2-17 depicts only simplified portions of a single MEMS device. The foregoing example notwithstanding, MEMS substrate 82 may comprise any substrate on which MEMS device 80 can be fabricated including, for example, multi-layer substrates (e.g., Silicon-On-Insulator substrates), substrates composed of non-silicon semiconductor materials, and substrates composed of materials other than semiconductor materials.

As indicated in FIG. 2, one or more via openings 88 are etched into or otherwise formed in MEMS substrate 82. Each via opening 88 extends a predetermined depth $D_1$ into MEMS substrate 82 from the principal upper surface 84 thereof, but does not extend to underside 86 of MEMS substrate 82 to fully penetrate substrate 82. Depending upon their particular dimensions, via openings 88 may be produced utilizing any material removal process suitable for forming high aspect ratio features including, for example, Deep Reactive Ion Etch (DRIE) processes. The particular dimensions of via openings 88 will vary amongst embodiments. However, by way of example, via openings 88 may be formed to each have a depth of about 150 to about 350 µm, as measured from upper surface 84 of MEMS substrate 82; a lateral width (taken along the plane of the page in FIG. 2 or along the X-axis in FIG. 16) between about 5 and about 100 µm and, more preferably, between about 10 and about 50 µm; and a length (taken into the page in FIG. 2 or along the Y-axis in FIG. 16) between about 5 and about 100 µm and, more preferably, between about 10 and about 50 µm.

Figure 3:
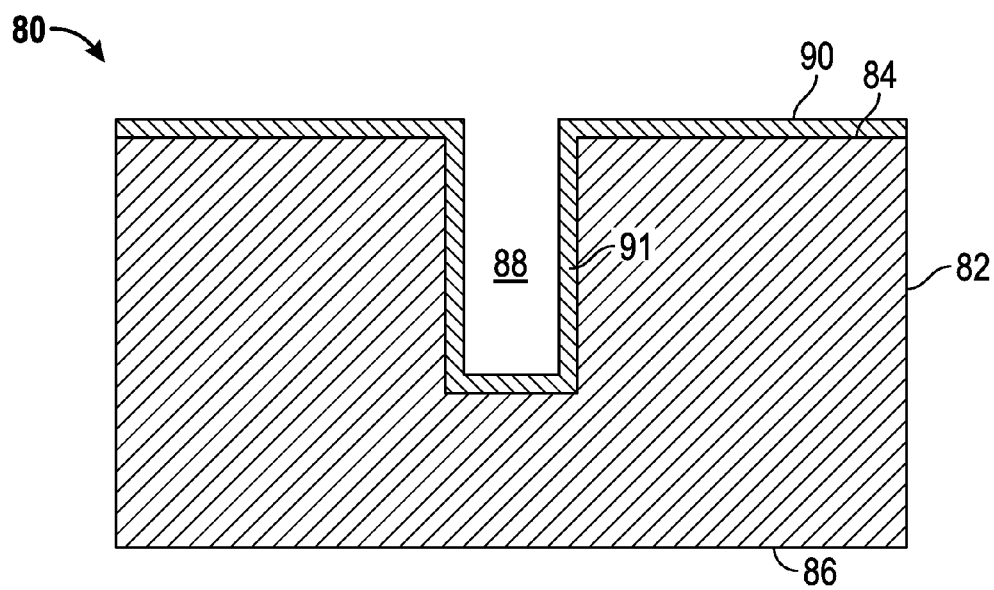

Turning to FIG. 3, a dielectric layer 90 may next be formed over the upper surface of MEMS substrate 82. Dielectric layer 90 is also formed over the inner surfaces of substrate 82 defining via openings 88 to produce a number of TSV isolation liners 91 (one of which is shown in FIG. 3). Dielectric layer 90 and TSV isolation liners 91 may be integrally formed as an oxide (collectively referred to herein as a "substrate oxide layer 90, 91") thermally grown to a thickness of, for example, about 2 µm. In embodiments wherein MEMS substrate 82 is composed of silicon, substrate oxide layer 90, 91 will grow as silicon oxide over the exposed surfaces of substrate 82, including the inner surfaces of substrate 82 defining the sidewalls and floor of each via opening 88. Alternatively, substrate oxide layer 90, 91 can be deposited utilizing, for example, a chemical vapor deposition ("CVD") process.

Figure 4:
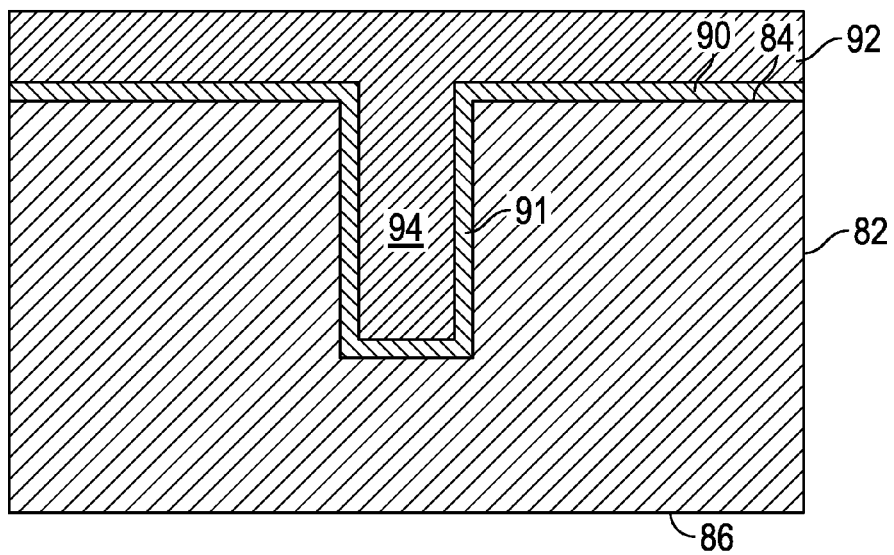
Figure 5:
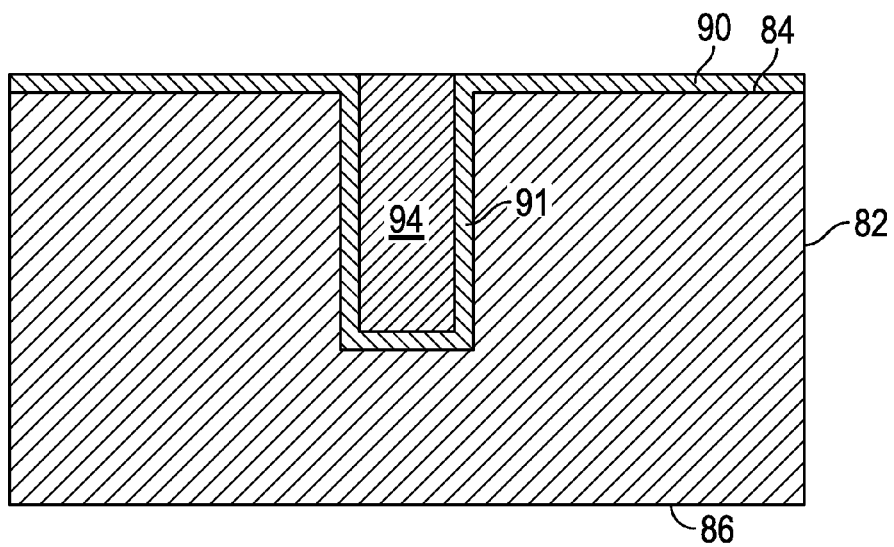

After formation of substrate oxide layer 90, 91, a layer of electrically-conductive material 92 is deposited over the upper surface of dielectric layer 90, over the upper surfaces of TSV isolation lines 91, and into via opening 88. As shown in FIG. 4, such a deposition process results in the filling of via opening 88 with the electrically-conductive material to yield a filled via 94. Via 94 and the other non-illustrated vias are buried at this juncture in the manufacturing process; that is, the lower terminal end of via 94 has not yet been exposed through the bottom surface of MEMS substrate 82 to produce a TSV extending entirely through substrate 82. Electrically-conductive layer 92 may be formed by deposition of polycrystalline silicon utilizing a CVD or physical vapor deposition ("PVD") process. After deposition of electrically-conductive layer 92, a Chemical Mechanical Planarization ("CMP") process may be utilized to polish back to dielectric layer 90 and thereby remove the portion of layer 92 overlying the upper surface of MEMS substrate 82, while leaving via 94 and its surrounding liner 91 intact. The resultant structure is shown in FIG. 5.

The term "filled," as appearing herein, denotes that a sufficient quantity of electrically-conductive material has been introduced into a contact or via opening to provide an electrically-conductive path therethrough. Thus, in some embodiments, via openings 88 formed in MEMS substrate 82 (shown in FIG. 4) may be partially filled or plated with an electrically-conductive material, such as polysilicon or a metal. For example, in certain embodiments, via openings 88 may be plated with a high temperature metal, such as tungsten, able to tolerate the elevated temperatures that may occur during thermal processing of MEMS device 80, as described below. The foregoing notwithstanding, it is preferred that via openings 88 are filled with an electrically-conductive material in their substantial entirety and, more preferably, completely filled with polycrystalline silicon to produce vias 94.

Figure 6:
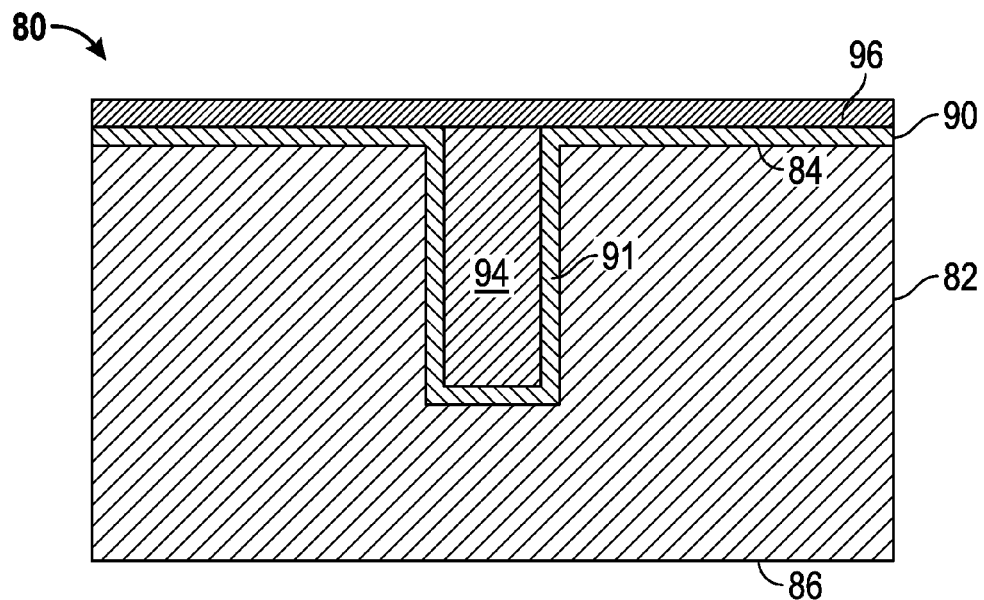
Figure 7:
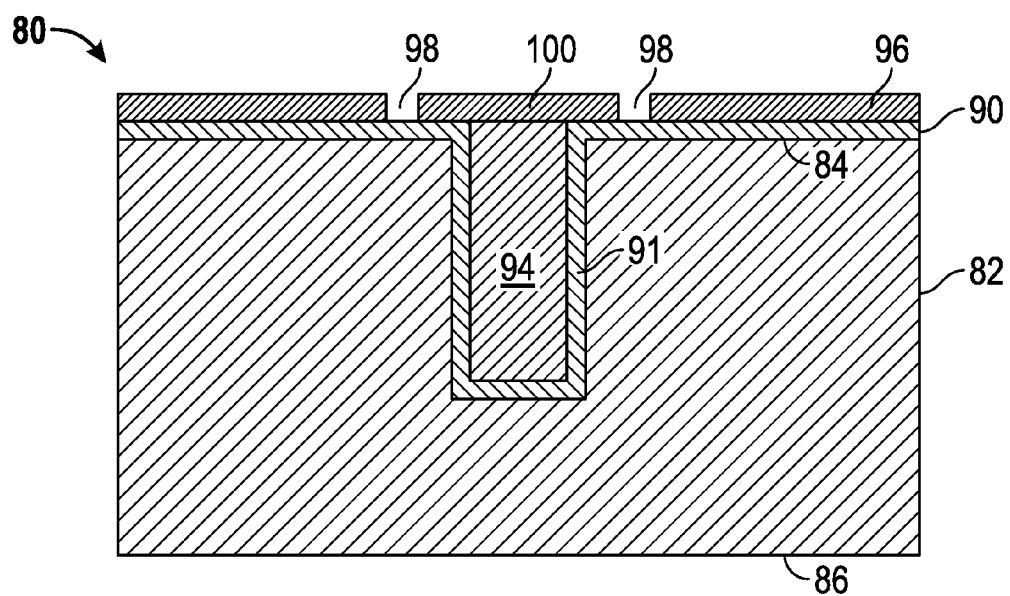

With reference FIG. 6, a layer of electrically-conductive material 96 next be deposited over the upper surface of dielectric layer 90 and filled via 94 (and the other non-illustrated vias formed in MEMS substrate 82). As electrically-conductive layer 96 is later patterned to define one or more interconnect lines, at least in some embodiments, layer 96 is referred to as "interconnect layer 96" hereafter. In one embodiment, interconnect layer 96 is composed of polycrystalline silicon deposited utilizing a CVD or PVD process. In another embodiment, interconnect layer 96 is composed of a deposited metal. Interconnect layer 96 may be deposited to thickness of about 0.3 μm in an embodiment, although layer 96 may be thicker or thinner in other embodiments. Interconnect layer 96 is illustrated in FIG. 7 after lithographical patterning has been carried-out to form a number of openings 98 therein and thereby define one or more interconnect lines within interconnect layer 96. Openings 98 may be left unfilled or may instead be filled with a sacrificial material during fabrication that is subsequently removed in the below-described manner. In either case, openings 98 define air gaps or voids that electrical isolate neighboring interconnect lines defined within patterned interconnect layer 96. In alternative embodiments, openings 98 may be filled with a dielectric material, which is not removed during subsequent fabrication steps; however, in such a case, the dielectric-filled openings still provide the requisite electrical isolation between neighboring interconnect lines of layer 96. Notably, in the illustrated embodiment, interconnect layer 96 is patterned to include at least one interconnect line 100 (partially shown in FIG. 7) in ohmic contact with filled via 94. In embodiments wherein MEMS device 80 is designed to sense acceleration along the Z-axis, electrically-conductive interconnect layer 96 may also be patterned to define one or more sense electrodes, which underlie the proof mass of subsequently-formed transducer structure 118 (described below).

Figure 8:
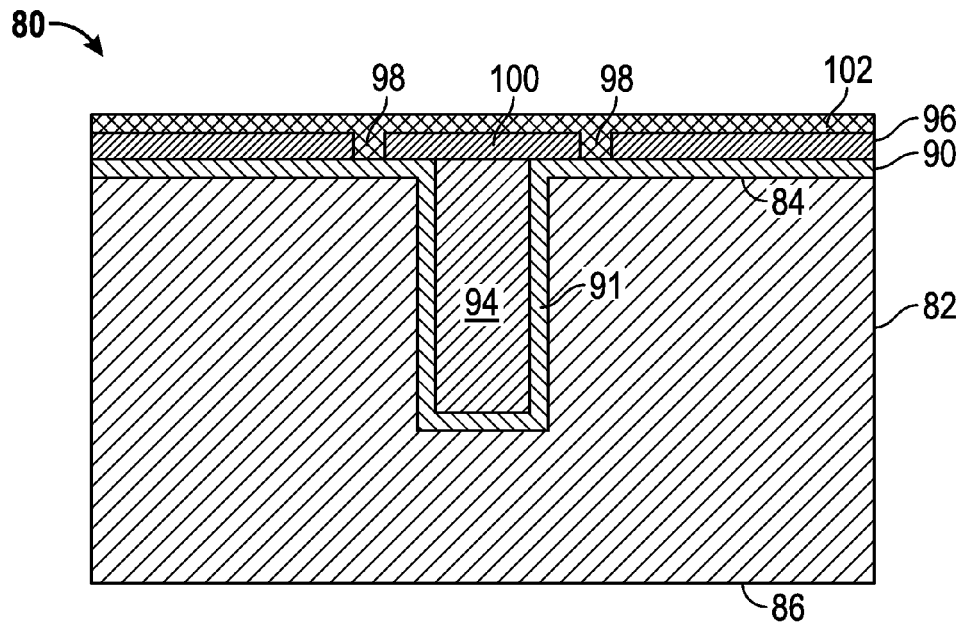

A sacrificial dielectric material is next deposited over the patterned interconnect layer 96 to fill openings 98 and yield a sacrificial dielectric layer 102 overlying interconnect layer 96, as shown in FIG. 8. Sacrificial dielectric layer 102 is conveniently formed from a deposited oxide; e.g., in one embodiment, dielectric layer 102 is a silicon oxide deposited utilizing a low temperature Plasma-Enhanced CVD or Low Pressure CVD with a silane ($SiH_4$) or tetraethylorthosilicate ($Si(OC_2H_5)_4$ or "TEOS") chemistry. Sacrificial dielectric layer 102 may be deposited to a thickness of about 3 μm in an embodiment, although dielectric layer 102 may be thicker or thinner in further embodiments. In embodiments wherein dielectric layer 102 is fusion bonded or otherwise joined to a separate transducer wafer, as described below in conjunction with FIG. 9, the upper surface of sacrificial dielectric layer 102 may be planarized utilizing, for example, a CMP process to facilitate the below-described bonding process.

Figure 9:
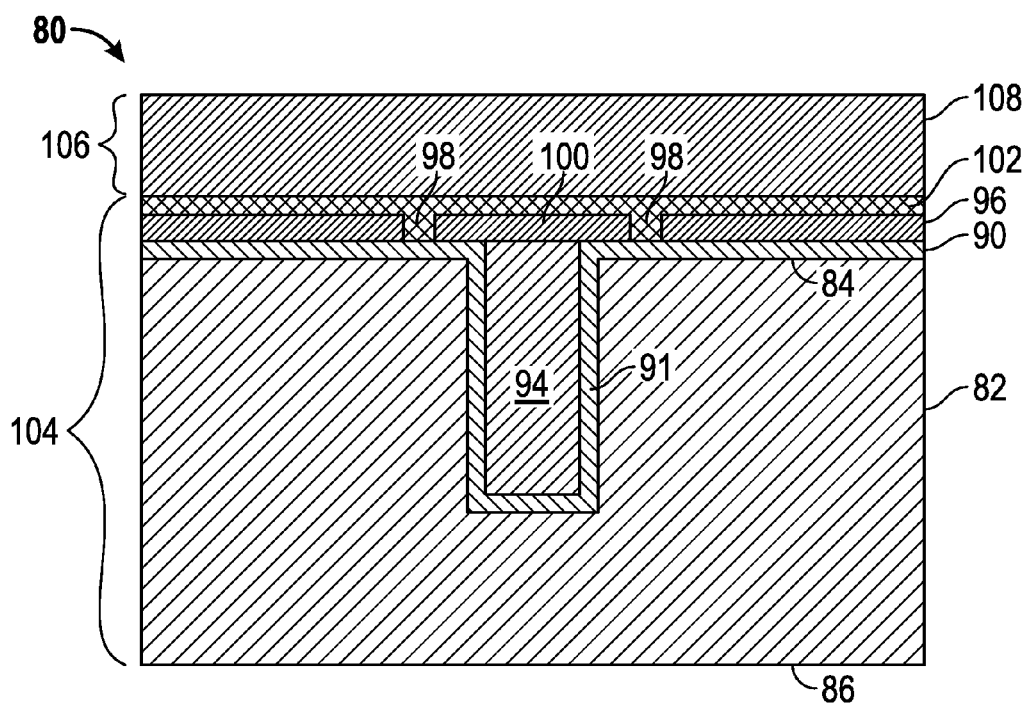

As previously indicated, embodiments of the fabrication method described herein are advantageously carried-out as modified HARMEMS processes wherein at least the MEMS substrate and the transducer layer are initially produced from discrete wafers or separate workpieces. In this regard, and as indicated in FIG. 9, a transducer workpiece or wafer may next be bonded to the substrate workpiece or wafer in which MEMS substrate 82 and the layers formed thereover are included. As only the portions of the substrate wafer and the transducer wafer ultimately included in the completed MEMS device 80 are shown in FIG. 9 (that is, the portions of the substrate wafer and transducer wafer not removed during singulation), these portions are referred to hereafter and identified in FIG. 9 as "substrate wafer portion 104" and "transducer wafer portion 106," respectively. Transducer wafer portion 106 includes an electrically-conductive transducer layer 108. In a preferred embodiment, transducer wafer portion 106 is an integral part of a larger bulk silicon wafer, and electrically-conductive transducer layer 108 is composed of single crystal silicon.

With continued reference to FIG. 9, fusion bonding is preferably employed to join substrate wafer portion 104 and transducer wafer portion 106 and, more generally, the larger substrate wafer to the larger transducer wafer. In the illustrated example, the transducer wafer and, thus, the illustrated transducer wafer portion 106 includes only the bulk semiconductor material or electrically-conductive material making-up an electrically-conductive transducer layer 108. In such instances when no additional intervening layers have been formed over the substrate wafer, electrically-conductive transducer layer 108 may be joined directly to sacrificial dielectric layer 102 by fusion bonding or another bonding technique. However, in further embodiments, the transducer wafer may have undergone additional processing at this juncture in the fabrication process, and transducer wafer portion 106 may include one or more intervening layers, such as an oxide layer deposited on or grown over at least the underside of the transducer wafer. If desired, annealing may be performed after substrate bonding by exposing partially-fabricated MEMS device 80 to elevated temperatures exceeding, for example, about 1000° C. for a predetermined period of time (e.g., about 1 to 3 hours) to enhance bond strength.

Figure 10:
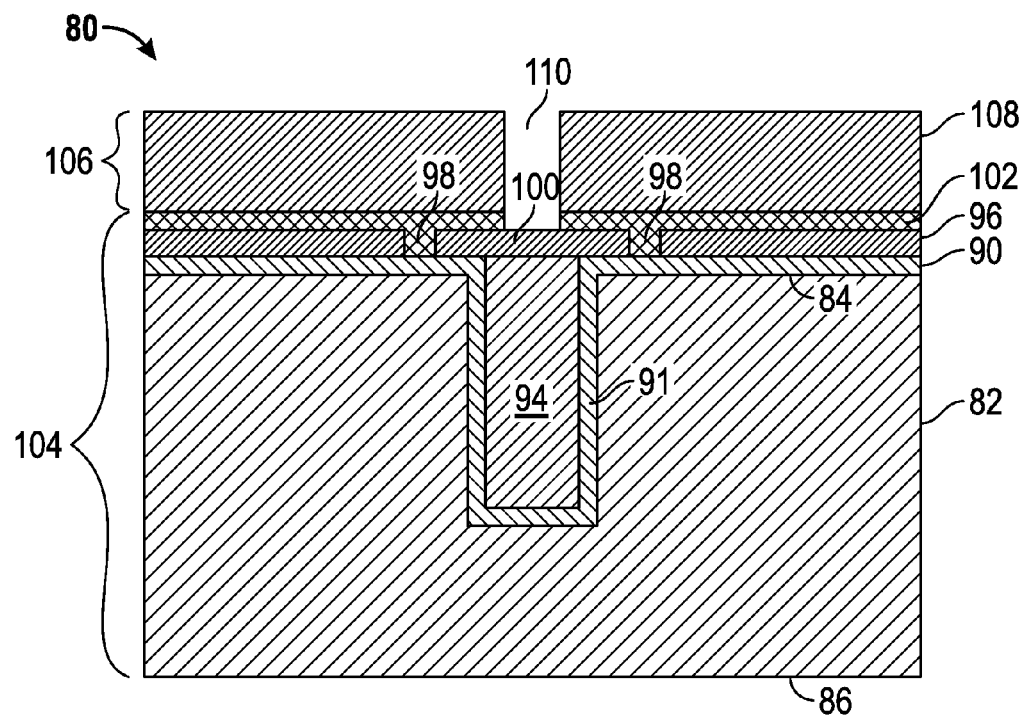

At least one opening or blind tunnel is next formed through electrically-conductive transducer layer 108 and underlying sacrificial dielectric layer 102. FIG. 10 illustrates partially-fabricated MEMS device 80 after the formation of one such opening 110, which extends through layers 108 and 102 to expose a region of underlying interconnect layer 96 and, specifically, the interconnect line 100 in ohmic contact with filled via 94. In the illustrated example, opening 110 aligns with or overlaps with filled via 94, as taken along an axis orthogonal to the upper surface of substrate 82 (the Z-axis in FIG. 17); however, this need not always be the case. Opening 110 may be formed utilizing a DRIE process utilizing etch chemistries selective to the materials from which transducer layer 108 and the underlying dielectric layer 102 are formed, although various other material removal processes can also be employed suitable for forming high aspect ratio features. As indicated in FIG. 10, opening 110 may be formed to have a width less than the width of the underlying via 94; e.g., in one embodiment, opening 110 is formed to have a width between about 1 and about 10 μm.

Figure 11:
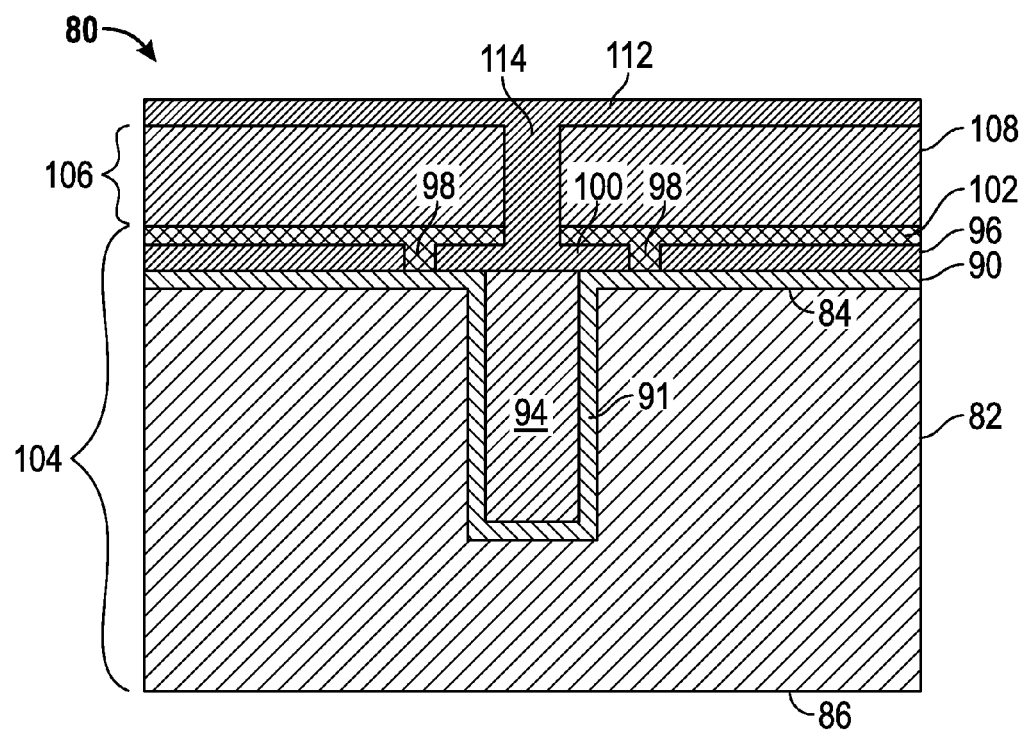
Figure 12:
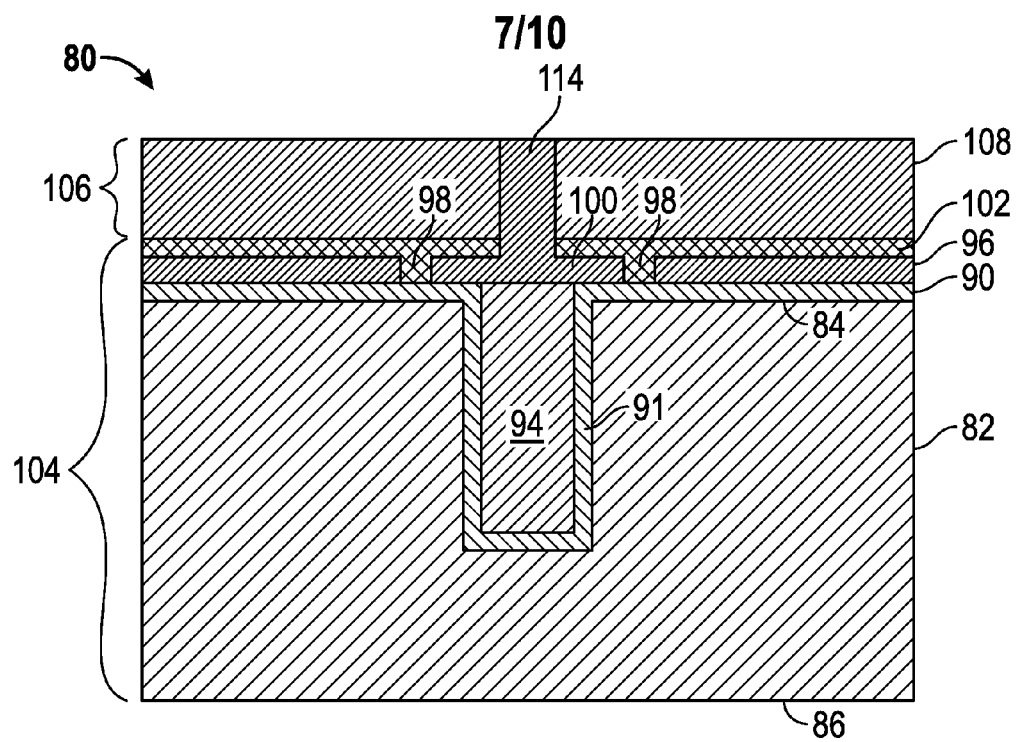

After formation of opening 110 (FIG. 10), an electrically-conductive material is deposited over the upper surface of transducer layer 108 and into opening 110 to yield an electrically-conductive overburden layer 112 overlying transducer layer 108 and an electrically-conductive body or plug 114 integrally formed therewith (shown in FIG. 11). Electrically-conductive plug 114 extends through transducer layer 108, through sacrificial dielectric layer 102, and to interconnect line 100 formed in interconnect layer 96. Electrically-conductive plug 114 thus ohmically contacts both the interior surfaces of transducer layer 108 defining the now-filled opening 110 (again, identified in FIG. 10) and the upper surface of interconnect line 100. In so doing, electrically-conductive plug 114 cooperates or combines with interconnect line 100 to provide an electrically-conductive path from transducer layer 108 to via 94. It should be noted that, while electrically-conductive plug 114 vertically aligns with filled via 94 in the illustrated example (again, as taken along an axis orthogonal to the upper surface of MEMS substrate 82 or along the Z-axis in FIG. 17), this is not necessary in all embodiments; instead, in other embodiments, electrically-conductive plug 114 may be vertically offset with respect to filled via 94, and interconnect line 100 may extend in one or more various direction within the plane of interconnect layer 96 (along the X- and/or Y-axes in FIG. 17) to provide the desired electrical interconnection between plug 114 and buried via 94. In one implementation, electrically-conductive overburden layer 112 and electrically-conductive plug 114 are collectively formed via the deposition of polycrystalline silicon utilizing, for example, a CVD or PVD process. In another embodiment, overburden layer 112 and plug 114 are formed by deposition of a metal. After deposition of the electrically-conductive material over partially-fabricated MEMS device 80, electrically-conductive overburden layer 112 may be removed, in part or in its entirety, utilizing a CMP process or other material removal process. The structure shown in FIG. 12 results.

Figure 13:
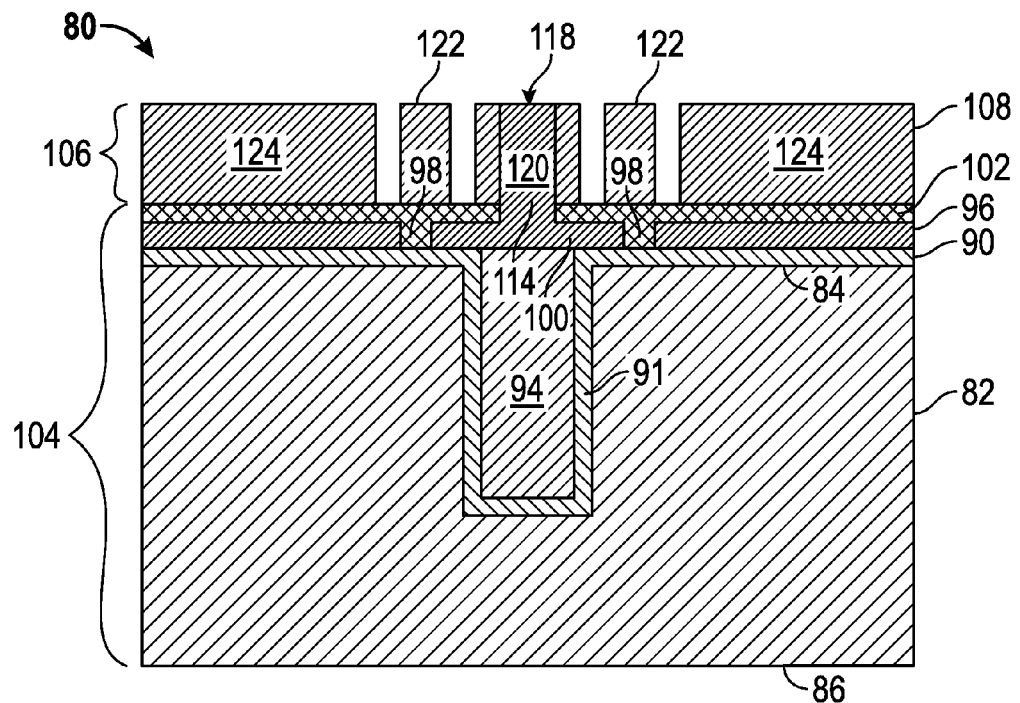
Figure 14:
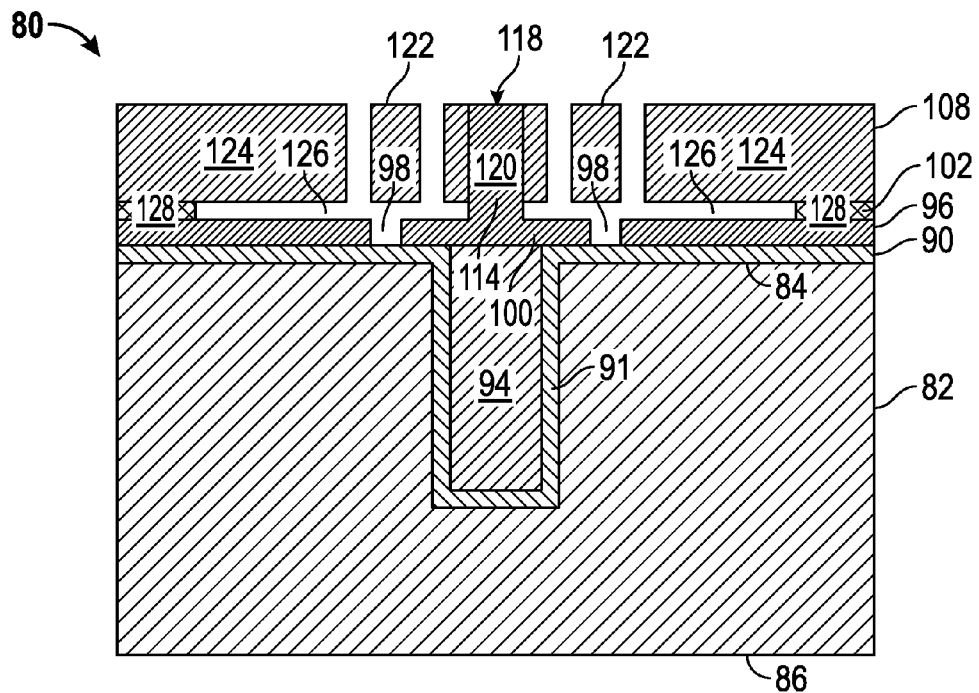

Advancing to FIG. 13, electrically-conductive transducer layer 108 may now be patterned to define a primary transducer structure 118 including a number of anchor regions 120, which are mechanically joined to one or more proof mass structures (hidden from view in FIG. 13) by way of spring members 122. In the illustrated example, transducer layer 108 is also patterned to include a peripheral rim region 124, which extends around and circumferentially encloses the primary transducer structure 118. Movement of the proof mass and spring members 122 is, however, prevented or impeded by underlying sacrificial dielectric layer 102. Sacrificial dielectric layer 102 is now removed, in whole or in part, to mechanically release the proof mass structure and spring members 122. For example, sacrificial dielectric layer 102 may be removed through the transducer layer openings utilizing an etchant having a chemistry selective to the parent material of sacrificial dielectric layer 102; e.g., in embodiments wherein sacrificial dielectric layer 102 is composed of a silicon oxide, a wet etch or vapor-based etch utilizing a fluoride-based etch chemistry may be employed. The resultant structure is shown in FIG. 14 wherein void area 126 has been produced via the removal of sacrificial dielectric layer 102 thereby mechanically releasing spring members 122 and the non-illustrated proof mass structure. A peripheral portion 128 of sacrificial dielectric layer 102 has, however, intentionally been left intact underlying peripheral rim region 124 of transducer layer 108 to facilitate hermetic sealing of MEMS device 80. Removal of the central portion of sacrificial dielectric layer 102 in this manner exposes electrically-conductive plug 114, which serves as an electrically-conductive base member or neck region in ohmic contact with a region of primary transducer structure 118 (e.g., anchor region 120 in the illustrated example). This region of primary transducer structure 118 is thus electrically coupled to via 94 through plug 114 and the underlying portion of interconnect layer 96 (e.g., interconnect line 100 in the illustrated example).

Figure 15:
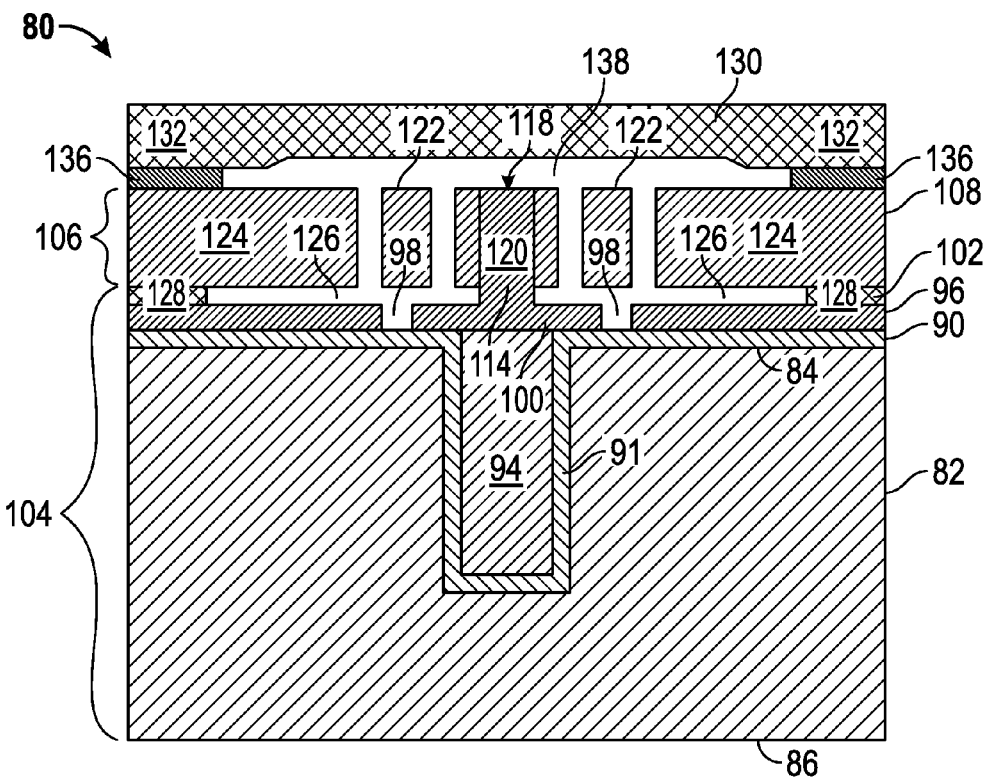

FIG. 15 illustrates partially-fabricated MEMS device 80 after attachment of a cover piece (referred to herein as "MEMS cap 130"). As shown in FIG. 15, MEMS cap 130 includes a lower circumferential wall or rim portion 132, which is sealingly joined to outer peripheral region 124 of transducer layer 108; e.g., in an embodiment, rim portion 132 of MEMS cap 130 may be bonded to peripheral region 124 of transducer layer 108 utilizing a dielectric adhesive material 136. As taken around the perimeter of MEMS device 80, rim portion 132 of MEMS cap 130 and peripheral region 124 of transducer layer 108 are continuous or unbroken structures. Thus, rim portion 132 of MEMS cap 130 and peripheral portion 134 of transducer layer 108 cooperate to hermetically enclose the interior region of MEMS device 80, which houses primary transducer structure 118, to prevent environmental contamination thereof. An inner depression or cavity 138 may be formed in the underside of MEMS cap 130 to accommodate deflection of the proof mass of primary transducer structure 118 along the Z-axis (upward in the illustrated orientation). MEMS cap 130 may be produced from a discrete cap wafer, which is bonded to the MEMS wafer and subsequently singulated to define cap 130 along with a number of similar caps bonded to neighboring MEMS devices produced in parallel with MEMS device 80. This example notwithstanding, MEMS device 80 need not include a cover piece or cap in all embodiments.

Figure 16:
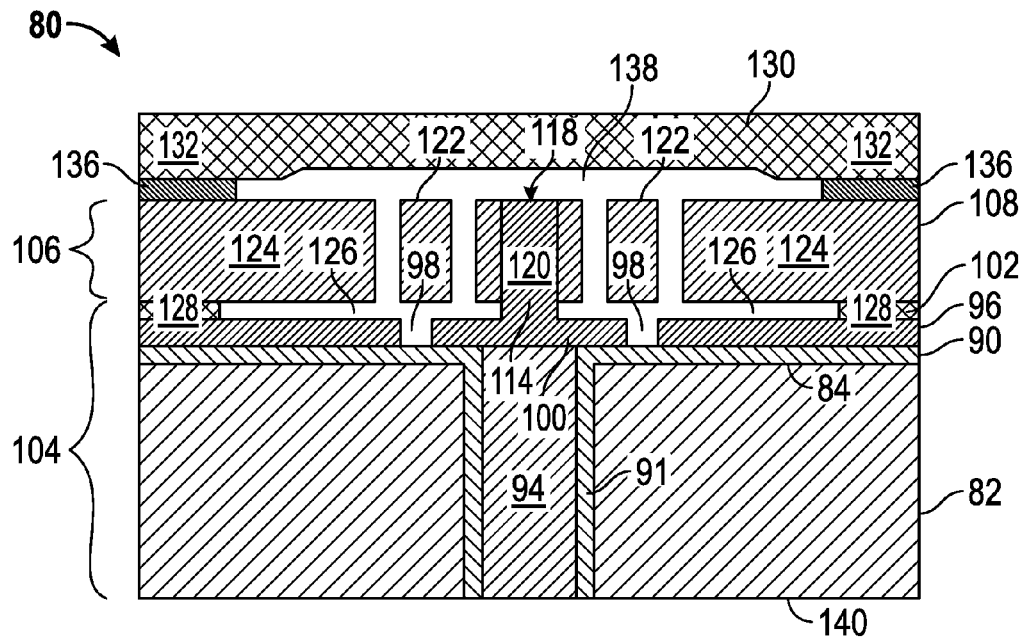

After attachment of MEMS cap 130 (FIG. 14), MEMS substrate 82 is thinned to reveal via 94 and the other non-illustrated vias through a bottom surface thereof and thereby produce a number of TSVs extending entirely through substrate 62. FIG. 16 illustrates partially-fabricated MEMS device 80 after thinning of MEMS substrate 82 and exposure of buried via 94 through a newly-formed bottom surface 140 thereof. The lower regions of TSV isolation liners 91 are also removed during substrate thinning to ultimately expose the lower region of via 94 and the other non-illustrated vias. During the thinning process, sufficient material may be removed from the backside of MEMS substrate 82 to impart substrate 82 with a predetermined final thickness of, for example, about 100 to about 300 μm. While any process or combination of processes suitable for removal material from the backside of MEMS substrate 82 to reveal the TSVs therethrough can be employed, grinding is preferably utilized to thin MEMS substrate 82. In alternative embodiments, substrate 82 may be ground or otherwise thinned prior to attachment of MEMS cap 130, if included within MEMS device 80; however, it is preferred that MEMS substrate 82 is thinned after MEMS cap attachment to structurally reinforce the partially-fabricated MEMS device during the thinning process. As vias 94 now extend fully through MEMS substrate 82, vias 94 are referred to as "TSVs 94" hereafter.

Figure 17:
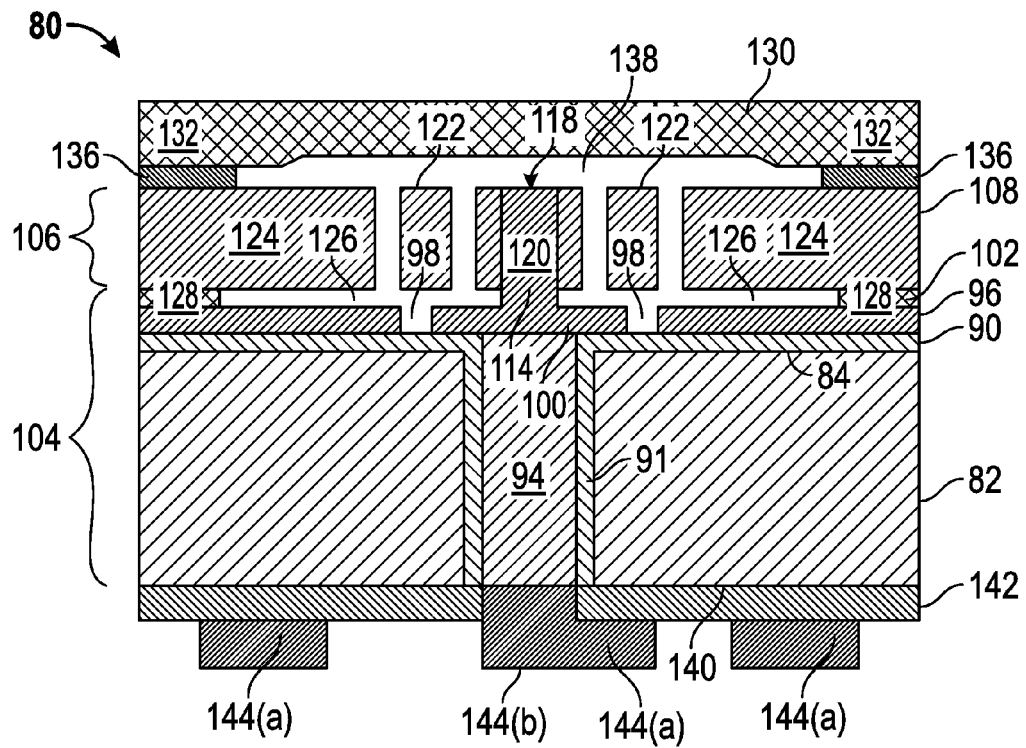

Continuing with the exemplary MEMS fabrication process, one or more electrically-conductive contacts (generically referred to herein as "backside conductors") are next formed over the backside 140 of MEMS substrate 82. With reference to FIG. 17, a backside dielectric layer 116 may first be formed over bottom surface 140 of thinned MEMS substrate 82 utilizing, for example, CVD, PVD, or a spin-on deposition process. Backside dielectric layer 142 may then be lithographically patterned to expose vias 94 therethrough. An electrically-conductive layer 144 (e.g., copper or another metal) may then be deposited over dielectric layer 142 and patterned to form a number of bond pads 144(a). Bond pads 144(a) may be in direct ohmic contact with TSVs 94 and, consequently, interconnect lines may be unnecessary in certain embodiments. However, bond pads 144(a) will often not align or be vertically offset with respect to TSVs 94, as taken along the Z-axis in FIG. 17. Consequently, additional backside conductors may also be formed to interconnect bond pads 144(a) with their associated TSVs 94. For example, as shown in FIG. 17, electrically-conductive layer 144 may further be patterned to include at least one interconnect lines 144(b), which extends over the backside of MEMS substrate 82 to electrically connect the illustrated via 94 with one of the illustrated bond pads 144(a). If desired, a non-illustrated passivation dielectric layer can be formed, for example, utilizing CVD, PVD, or a spin-on method and patterned to protect the metal layers from scratching and other physical damage. Conventional manufacturing steps may then be carried-out to complete fabrication and packaging of MEMS device 80 including, for example, electrical interconnection of MEMS device 80 with neighboring integrated circuit (IC), which may be encapsulated with MEMS device 80 in a common package. As bond pads 144(*a*) are located at an elevation substantially equivalent to the elevation of the bottom most surface of MEMS device 80, MEMS device 80 is well-suited for interconnection to, for example, a printed circuit board utilizing a CSP packaging technique. Such packaging approaches include both 2D and 3D (stacked) packaging approaches, such as Flip Chip (FC) Package-on-Package (PoP), Thru Mold Via (TMV) FC PoP, and RCP PoP packaging approaches.

It should thus be appreciated that backside bond pads 144(*a*) are formed over the bottom or lower surface 140 of MEMS substrate 82 in the case of the exemplary MEMS device 80 (FIG. 17) produced as a result of the above-described fabrication process. As a result, MEMS device 80 is not required to include a laterally-projecting bond shelf to support bond pads 144(*a*). MEMS device 80 may thus lack any such bond shelf in some embodiments; and, assuming device 80 to have a generally rectangular planform shape, the four lateral sides of MEMS cap 130 may be substantially vertically flush with the four lateral sides of transducer layer 108, substrate 82, and the other layers of MEMS device 80, as shown in FIG. 17. Relative to a comparable MEMS device including a laterally-projecting bond shelf, such as bond shelf 44 of MEMS device 20 shown in FIG. 1, the footprint of MEMS die is consequently reduced by a significant margin. More specifically, a die size reduction of about 15% to about 30% can be achieved in certain implementations. Through this reduction in die size, cost savings are also realized, which may render the above-described fabrication method cost neutral or less costly to performed as compared to conventional MEMS fabrication methods. Furthermore, by relocating the MEMS bond pads to the underside of the MEMS substrate 82, fewer spatial constraints are placed the positioning or arrangement of the bond pad array as compared to conventional bond-shelf architectures. As a still further advantage, MEMS device 80 is amenable to RCP packaging and CSP packaging techniques as bond pads 144(*a*) of MEMS device 80 are disposed on the lowermost surface of device 80. Finally, as the need for metal routing or other interconnect features on the MEMS cap is eliminated, embodiments of MEMS device 80 can be produced utilizing dumb caps lacking interconnect features to further simply processing and reduce manufacturing costs. The foregoing notwithstanding, embodiments of MEMS device 80 can also be produced pursuant to the above-described fabrication method including one or more TSVs in combination with one or more bond pad shelves and/or a "smart" MEMS cap including metal routing.

Figure 18:
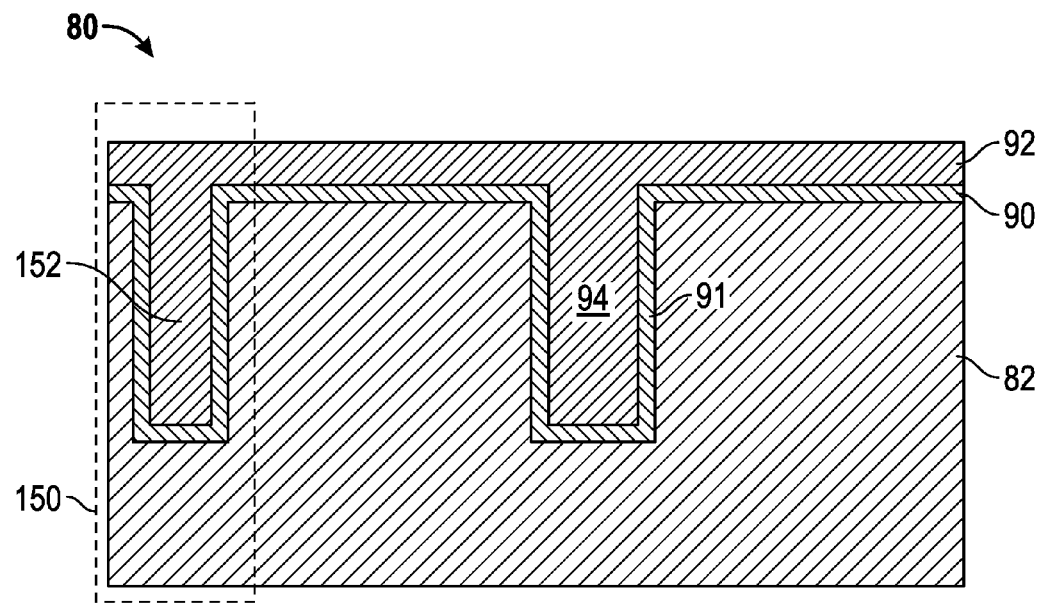
FIGS. 18 and 19 are simplified cross-sectional view of the partially-completed MEMS device of FIGS. 4 and 16, respectively, but with a larger area of the MEMS device shown to illustrate one manner in which photolithography alignment features can conveniently be formed in parallel with one or more TSVs in preferred implementations of the MEMS fabrication method.
Figure 19:
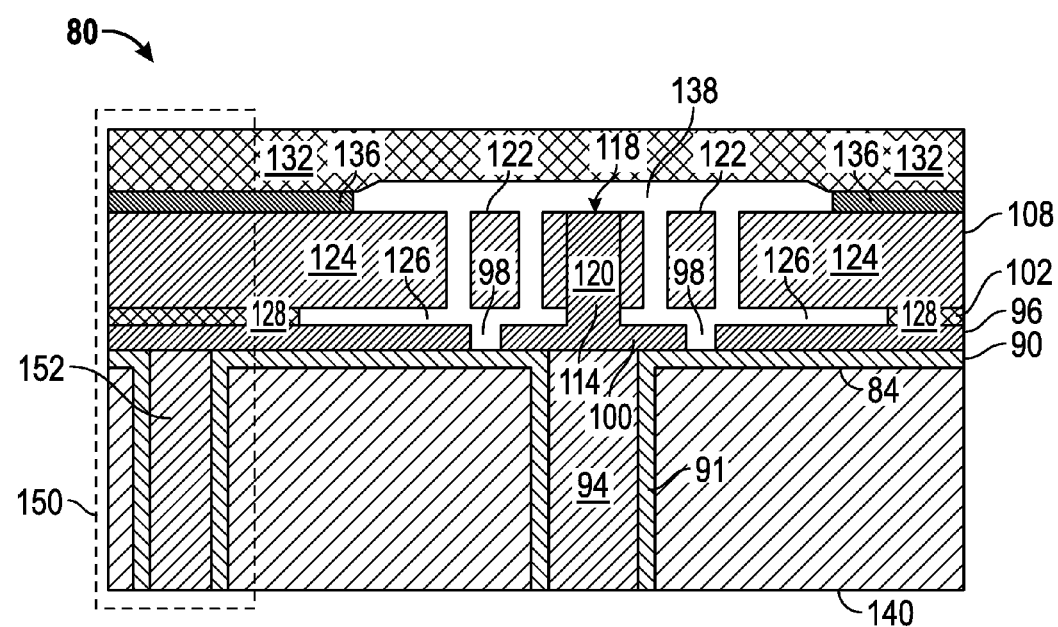

The above-described MEMS manufacturing technique can also be utilized to form photolithographical alignment features on the backside of the ground or thinned MEMS substrate in conjunction with formation of the TSVs. This may be more fully appreciated by referring to FIG. 18, which illustrates substrate wafer portion 104 prior to joinder to transducer wafer portion 106. FIG. 18 is identical to FIG. 4 with the exception that a larger portion of substrate wafer portion 104 is shown, as encompassed by dashed box 150 shown in the leftmost portion of FIG. 17. Here, MEMS device 80 has been fabricated to further include an embedded alignment feature 152, which extends into MEMS substrate 82 to a depth substantially equivalent to the illustrated via 94. Alignment feature 152 can be fabricated in parallel with via 94 utilizing the above-described process by further patterning substrate wafer portion 104 to include one or more additional alignment feature openings extending into, but not through MEMS substrate 82. Such openings may then be filled in conjunction with filling of the via openings, as described above in conjunction with FIG. 4. During the above-described back-grinding or thinning process, and as illustrated in FIG. 19, alignment features 152 are exposed along with vias 94 to provide convenient points of reference with which to align the lithographical tools utilized for patterning of layers 142 and 144. When viewed from a top-down or planform perspective, the particular design or shape of alignment features 152 will vary depending upon the requirements of the tool. Common alignment structure designs include circular shapes, annular shapes, frames, and rectangular shapes, to list but a few examples. So as to not unnecessarily increase the footprint of the finished MEMS device, alignment features 152 are preferable formed within the dicing streets or kerf areas removed from MEMS device 80 during dicing, as indicated in FIGS. 18 and 18 by dashed box 150.

There has thus been provided methods of fabricating an exemplary MEMS device including one or more TSVs, which enable the elimination of the bond pad shelf (at least in some embodiments) to bring about favorable reductions in die size and manufacturing costs. In preferred embodiments, the MEMS fabrication method described above are implemented as a modified HARMEMS process flow wherein separate substrate and transducer workpieces or wafers are bonded together during processing, possibly in conjunction with a separate MEMS cap wafer. Embodiments of the MEMS fabrication method facilitate the formation of photolithographical alignment features on the backside of the ground or thinned MEMS substrate in conjunction with formation of the TSVs. While at least one exemplary embodiment of the MEMS fabrication method has been provided above, numerous variations of this method are possible. For example, in one possible variation wherein the MEMS device does not include Z-axis electrodes defined by patterning of an interconnect layer, the interconnect layer (e.g., interconnect layer 96 shown in FIGS. 7-19) can potentially be eliminated with the desired interconnections provided solely utilizing backside routing.

In one embodiment, the above-described MEMS device fabrication method includes the steps of forming at least one via opening extending into a substrate wafer, depositing a body of electrically-conductive material over the substrate wafer and into the via opening to produce a via, and bonding the substrate wafer to a transducer wafer having an electrically-conductive transducer layer. The transducer wafer may include only the electrically-conductive transducer layer or may one or more additional layers in addition to the transducer layer, such as a dielectric layer (e.g., an oxide) formed over the transducer layer (e.g., silicon). An electrical connection is formed between the via and the electrically-conductive transducer layer during bonding or subsequent thereto. The electrical connection can be formed during bonding of the substrate wafer and the transducer wafer or after bonding by, for example, producing an electrically-conductive plug similar to plug 114 described above in conjunction with FIGS. 11-19. The substrate wafer is thinned to reveal the via through a bottom surface of the substrate wafer, and a backside conductor is produced over a bottom surface of the substrate wafer electrically coupled to the via. The backside conductor may be any electrically-conductive member or structure formed at least partially on or over the backside of the substrate, such as an interconnect line (e.g., a metal trace) or a backside bond pad.

In a further embodiment, the above-described MEMS device fabrication method includes the steps of bonding a transducer wafer, which includes an unpatterned transducer layer, to a substrate wafer comprising at least one via extending into a substrate and a sacrificial dielectric layer formed over an upper surface of the substrate, the transducer wafer comprising an unpatterned transducer layer. An electrically-conductive plug is formed to electrically couple the unpatterned transducer layer to the via after bonding the transducer wafer to the substrate wafer. The unpatterned transducer layer is then patterned after bonding the transducer wafer to the substrate wafer to define a primary transducer structure. At least a portion of the sacrificial dielectric layer is removed through at least one opening formed in the transducer layer during patterning thereof to release the primary transducer structure. The backside of the substrate is ground to remove a predetermined thickness therefrom reveal the via through a bottom surface of the substrate wafer. A backside conductor, such as an interconnect line or backside bond pad, is produced over a bottom surface of the substrate wafer electrically coupled to the via.

Embodiments of a MEMS device have also been provided. In one embodiment, the MEMS device includes a substrate having an top surface and a bottom surface. A backside conductor is formed over the bottom surface of the substrate, and a filled Through-Substrate-Via (TSV) extending through the substrate and contacting the backside conductor. A dielectric layer is disposed over the top surface of the substrate. A patterned transducer layer is, in turn, disposed over the dielectric layer and patterned to include a primary transducer structure. A patterned interconnect layer is located between the dielectric layer and the patterned transducer layer. The patterned interconnect layer is separated from the primary transducer structure by an air gap or void (e.g., 126 shown in FIGS. 14-17 and 19) and patterned to include an interconnect line in ohmic contact with the filled TSV. An electrically-conductive plug (e.g., plug 114 shown in FIGS. 11-19) extends from the primary transducer structure, through the air gap or void, and the interconnect line such that an electrically-conductive path is formed from the primary transducer structure, through the electrically-conductive plug, through the interconnect line, through the filled TSV, and to the backside conductor.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention, as set-forth in the appended claims.

What is claimed is:

1. A method of fabricating of a Microelectromechanical Systems ("MEMS") device, comprising:
    forming at least one via opening extending into a substrate wafer;
    depositing a body of electrically-conductive material over the substrate wafer and into the via opening to produce a via;
    bonding the substrate wafer to a transducer wafer having an electrically-conductive transducer layer;
    forming an electrical connection between the via and the electrically-conductive transducer layer;
    thinning the substrate wafer to reveal the via through a bottom surface of the substrate wafer;
    after thinning the substrate wafer, producing a backside conductor over the bottom surface of the substrate wafer electrically coupled to the via;
    forming a patterned interconnect layer over the substrate wafer; and
    forming a sacrificial dielectric layer over the patterned interconnect layer prior to bonding the substrate wafer to the transducer wafer.

2. The method of claim 1 further comprising patterning a layer of the transducer wafer to define a primary MEMS transducer structure after bonding the substrate wafer to the transducer wafer.

3. The method of claim 1 wherein bonding comprises fusion bonding the transducer wafer to the sacrificial dielectric layer.

4. The method of claim 1 further comprising:
    patterning the electrically-conductive transducer layer after bonding the substrate wafer to the transducer wafer; and
    removing at least a portion of the sacrificial dielectric layer through an opening formed in the electrically-conductive transducer layer during patterning thereof.

5. The method of claim 1 wherein forming an electrical connection between the via and the electrically-conductive transducer layer comprises producing an electrically-conductive plug electrically coupling the electrically-conductive transducer layer to the via after bonding the substrate wafer to the transducer wafer.

6. The method of claim 1 wherein an electrical connection is formed between the via and the electrically-conductive transducer layer after bonding the substrate wafer to a transducer wafer having an electrically-conductive transducer layer.

7. The method of claim 1 further comprising attaching a MEMS cap over the primary transducer structure, wherein thinning the substrate comprises grinding the backside of the substrate wafer after attachment of the MEMS cap to impart the substrate with a predetermined thickness.

8. The method of claim 1 further comprising forming at least one embedded lithographical alignment feature extending into the substrate and visible through the backside of the substrate wafer after thinning thereof.

9. The method of claim 8 wherein forming the at least one embedded lithographical alignment feature comprises:
    forming an alignment feature opening extending into the substrate wafer; and
    depositing a fill material into the alignment feature opening to produce the embedded lithographical alignment feature within the substrate;
    wherein the embedded lithographical alignment feature is revealed through the bottom surface of the substrate along with the via after thinning of the substrate wafer.

10. The method of claim 9 wherein the fill material comprises polycrystalline silicon, and wherein the alignment feature opening is filled, at least in substantial part, during deposition of the body of electrically-conductive material over the sacrificial layer and into the via opening.

11. The method of claim 1 wherein the backside conductor comprises a backside bond pad, and wherein the method further comprises forming at least one interconnect line over the backside of the substrate wafer electrically coupling the backside bond pad to the via.

12. The method of claim 1 further comprising packaging the MEMS device utilizing a chip scale package after producing the backside conductor on the backside of the substrate electrically coupled to the via.

13. The method of claim 5 further comprising patterning a layer of the transducer wafer to define a primary MEMS transducer structure after bonding the substrate wafer to the transducer wafer.

14. The method of claim 5 further comprising forming at least one embedded lithographical alignment feature extending into the substrate and visible through the backside of the substrate wafer after thinning thereof.

15. A method of fabricating of a Microelectromechanical Systems ("MEMS") device, comprising:
   forming at least one via opening extending into a substrate wafer;
   depositing a body of electrically-conductive material over the substrate wafer and into the via opening to produce a via;
   bonding the substrate wafer to a transducer wafer having an electrically-conductive transducer layer;
   producing an electrically-conductive plug electrically coupling the electrically-conductive transducer layer to the via after bonding the substrate wafer to the transducer wafer;
   thinning the substrate wafer to reveal the via through a bottom surface of the substrate wafer; and
   after thinning the substrate wafer, producing a backside conductor over the bottom surface of the substrate wafer electrically coupled to the via;
   wherein producing an electrically-conductive plug comprises:
      forming a sacrificial dielectric layer over the substrate wafer prior to bonding the substrate wafer to the transducer wafer;
      forming a patterned interconnect layer over the substrate wafer having a region in ohmic contact with the via;
      etching an opening through the electrically-conductive transducer layer, through the sacrificial dielectric layer, and to the region of the patterned interconnect layer in ohmic contact with the via; and
      filling the opening with an electrically-conductive material to produce the electrically-conductive plug.

16. The method of claim 15 wherein filling the opening comprises:
   depositing polycrystalline silicon into the opening and over an upper surface of the electrically-conductive transducer layer to produce the electrically-conductive plug and an electrically-conductive overburden layer; and
   removing the electrically-conductive overburden layer from over the electrically-conductive transducer layer using a polishing process.

17. The method of claim 15 further comprising:
   forming an interconnect layer over the substrate wafer prior to bonding the substrate wafer to the transducer wafer; and
   patterning the interconnect layer to define at least one interconnect line in ohmic contact with the via.

18. A method of fabricating of a Microelectromechanical Systems ("MEMS") device, comprising:
   bonding a transducer wafer to a substrate wafer, the substrate wafer comprising at least one via extending into a substrate and a sacrificial dielectric layer formed over an upper surface of the substrate, the transducer wafer comprising an unpatterned transducer layer;
   forming an electrically-conductive plug electrically coupling the unpatterned transducer layer to the via after bonding the transducer wafer to the substrate wafer;
   patterning the unpatterned transducer layer to define a primary transducer structure;
   removing at least a portion of the sacrificial dielectric layer through at least one opening formed in the transducer layer during patterning thereof to release the primary transducer structure;
   grinding the backside of the substrate to remove a predetermined thickness therefrom reveal the via through a bottom surface of the substrate wafer; and
   producing at least one backside conductor over the bottom surface of the substrate wafer electrically coupled to the via.

19. The method of claim 18 wherein the substrate wafer comprises an embedded alignment feature, and wherein grinding comprises grinding the backside of the substrate to remove a predetermined thickness therefrom and reveal the via and the embedded alignment feature through a bottom surface of the substrate wafer.

20. The method of claim 18 wherein producing at least one backside conductor comprises producing a backside bond pad and an interconnect line over the bottom surface of the substrate wafer, the interconnect line electrically coupling the backside bond pad to the via.

* * * * *